(12) United States Patent
Suwa et al.

(10) Patent No.: US 11,563,094 B2
(45) Date of Patent: Jan. 24, 2023

(54) SEMICONDUCTOR DEVICE HAVING THERMALLY CONDUCTIVE ELECTRODES

(71) Applicants: Kabushiki Kaisha Toshiba, Tokyo (JP); Toshiba Electronic Devices & Storage Corporation, Tokyo (JP)

(72) Inventors: Takeshi Suwa, Kawasaki Kanagawa (JP); Tomoko Matsudai, Shibuya Tokyo (JP); Yoko Iwakaji, Meguro Tokyo (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 16/813,277

(22) Filed: Mar. 9, 2020

(65) Prior Publication Data

US 2021/0083060 A1    Mar. 18, 2021

(30) Foreign Application Priority Data

Sep. 17, 2019   (JP) .............................. JP2019-168448

(51) Int. Cl.
  *H01L 29/40*   (2006.01)
  *H01L 29/06*   (2006.01)
  (Continued)

(52) U.S. Cl.
  CPC ........ *H01L 29/407* (2013.01); *H01L 29/0623* (2013.01); *H01L 29/1095* (2013.01); *H01L 29/404* (2013.01); *H01L 29/7397* (2013.01)

(58) Field of Classification Search
  CPC ............. H01L 29/7813; H01L 29/7825; H01L 29/66613–66628; H01L 29/42336;
  (Continued)

(56) References Cited

U.S. PATENT DOCUMENTS

2002/0179976 A1   12/2002  Takahashi
2003/0047778 A1    3/2003  Nakamura et al.
(Continued)

FOREIGN PATENT DOCUMENTS

JP         2002-353456 A   12/2002
JP           3701227 B2     9/2005
(Continued)

*Primary Examiner* — Mohammad M Hoque
(74) *Attorney, Agent, or Firm* — Allen & Overy LLP (57) ABSTRACT

A semiconductor device includes a semiconductor part, a first electrode at a back surface of the semiconductor part; a second electrode at a front surface of the semiconductor part; third and fourth electrodes provided between the semiconductor part and the second electrode. The third and fourth electrodes are arranged in a first direction along the front surface of the semiconductor part. The third electrode is electrically insulated from the semiconductor part by a first insulating film. The third electrode is electrically insulated from the second electrode by a second insulating film. The fourth electrode is electrically insulated from the semiconductor part by a third insulating film. The fourth electrode is electrically isolated from the third electrode. the third and fourth electrodes extend into the semiconductor part. The fourth electrode includes a material having a larger thermal conductivity than a thermal conductivity of a material of the third electrode.

14 Claims, 11 Drawing Sheets

(51) Int. Cl.
*H01L 29/739* (2006.01)
*H01L 29/10* (2006.01)

(58) Field of Classification Search
CPC ........... H01L 29/42352; H01L 29/4236; H01L 2924/13092; H01L 29/7831–7832; H01L 29/66484; H01L 21/823437–823456; H01L 21/823842; H01L 29/435; H01L 29/495–4958; H01L 29/4966–4975; H01L 21/28061; H01L 21/28079–28088; H01L 21/32051–32053; H01L 29/66515; H01L 21/28097; H01L 29/66325–66348; H01L 29/7393–7398; H01L 2924/13055; H01L 29/083–0834; H01L 29/407; H01L 29/0623; H01L 29/7397; H01L 29/404; H01L 29/1095
USPC .......................................................... 257/139
See application file for complete search history.

(56) References Cited

U.S. PATENT DOCUMENTS

| | | | |
|---|---|---|---|
| 2003/0080375 A1 | 5/2003 | Takahashi et al. | |
| 2012/0292662 A1* | 11/2012 | Matsuura | H01L 29/1095 257/E29.198 |
| 2012/0319199 A1* | 12/2012 | Zeng | H01L 29/41766 257/334 |
| 2013/0256745 A1* | 10/2013 | Tang | H01L 29/0821 257/139 |
| 2015/0221756 A1* | 8/2015 | Vellei | H01L 29/7813 257/139 |
| 2016/0133742 A1 | 5/2016 | Okuda et al. | |
| 2016/0218101 A1* | 7/2016 | Gejo | H01L 29/8613 |
| 2017/0250260 A1 | 8/2017 | Bina et al. | |
| 2017/0271488 A1* | 9/2017 | Udrea | H01L 29/0804 |
| 2018/0097094 A1* | 4/2018 | Naito | H01L 29/1004 |
| 2019/0058055 A1* | 2/2019 | Lee | H01L 29/0649 |
| 2019/0109131 A1* | 4/2019 | Naito | H01L 29/0619 |
| 2019/0214491 A1* | 7/2019 | Sumitomo | H01L 29/739 |
| 2020/0091325 A1 | 3/2020 | Matsudai et al. | |
| 2022/0238698 A1* | 7/2022 | Moore | H01L 21/308 |

FOREIGN PATENT DOCUMENTS

| | | |
|---|---|---|
| JP | 2006-351924 A | 12/2006 |
| JP | 4910304 B2 | 4/2012 |
| JP | 2016-92338 A | 5/2016 |
| JP | 6237227 B2 | 11/2017 |
| JP | 2020-47756 A | 3/2020 |
| WO | 02-061845 A1 | 8/2002 |

* cited by examiner

SEMICONDUCTOR DEVICE HAVING THERMALLY CONDUCTIVE ELECTRODES

CROSS-REFERENCE TO RELATED APPLICATIONS

This application is based upon and claims the benefit of priority from Japanese Patent Application No. 2019-168448, filed on Sep. 17, 2019; the entire contents of which are incorporated herein by reference.

FIELD

Embodiments relate to a semiconductor device.

BACKGROUND

It is desirable for a semiconductor device to have high resistance to breakdown modes caused by heat generation when operating.

DETAILED DESCRIPTION

According to one embodiment, a semiconductor device includes a semiconductor part including a first semiconductor layer of a first conductivity type; a first electrode provided at a back surface of the semiconductor part; a second electrode provided at a front surface of the semiconductor part; third and fourth electrodes provided between the semiconductor part and the second electrode. The third and fourth electrodes are arranged in a first direction, the first direction being along the front surface of the semiconductor part. The third electrode is electrically insulated from the semiconductor part by a first insulating film. The third electrode is electrically insulated from the second electrode by a second insulating film. The fourth electrode is electrically insulated from the semiconductor part by a third insulating film. The fourth electrode is electrically isolated from the third electrode. The semiconductor part further includes a second semiconductor layer of a second conductivity type and a third semiconductor layer of the first conductivity type. The second semiconductor layer is provided between the first semiconductor layer and the second electrode. The third semiconductor layer is selectively provided between the second semiconductor layer and the second electrode. The third semiconductor layer contacts the first insulating film. The second semiconductor layer and the third semiconductor layer are electrically connected to the second electrode. The third electrode opposes the second semiconductor layer with the first insulating film interposed, and the third electrode extends into the first semiconductor layer. The fourth electrode opposes the second semiconductor layer with the third insulating film interposed, and the fourth electrode extends into the first semiconductor layer. The third and fourth electrodes include end portions positioned inside the first semiconductor layer. The fourth electrode includes a material having a larger thermal conductivity than a thermal conductivity of a material of the third electrode.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

First Embodiment

Figure 1:
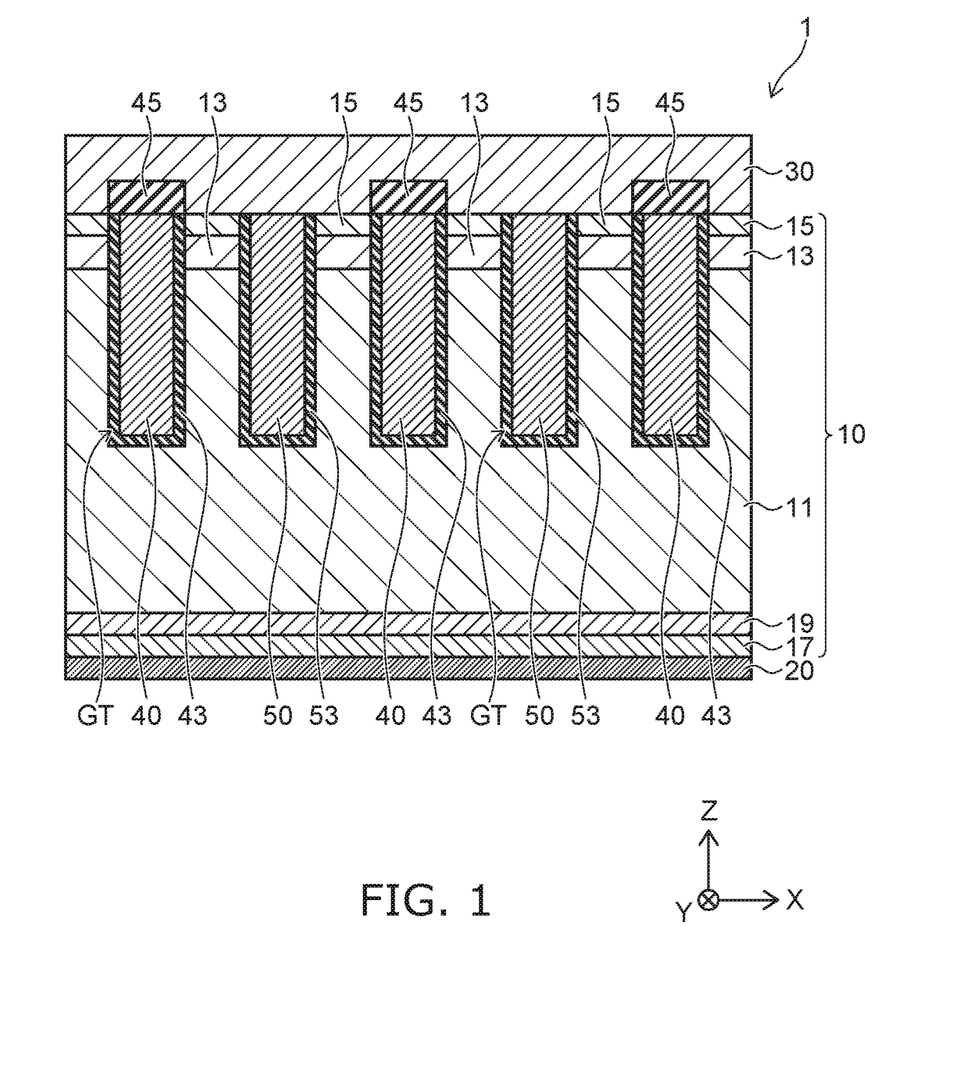
FIG. 1 is a schematic cross-sectional view showing a semiconductor device according to a first embodiment.

FIG. 1 is a schematic cross-sectional view showing a semiconductor device 1 according to a first embodiment. The semiconductor device 1 is, for example, an IGBT (Insulated Gate Bipolar Transistor).

As shown in FIG. 1, the semiconductor device 1 includes a semiconductor part 10, a first electrode 20, a second electrode 30, a third electrode 40 and a fourth electrode 50. The semiconductor part 10 is, for example, silicon. The first electrode 20 is, for example, a collector electrode. The first electrode 20 is provided at the back surface of the semiconductor part 10. The second electrode 30 is, for example, an emitter electrode. The second electrode 30 is provided at the front surface of the semiconductor part 10. The second electrode 30 includes, for example, aluminum, tungsten, etc. The first electrode 20 includes, for example, gold, germanium, nickel, etc.

The third electrode 40 is, for example, a gate electrode. The third electrode 40 is provided in a trench GT at the front surface of the semiconductor part 10. The third electrode 40 is provided between the semiconductor part 10 and the second electrode 30. The third electrode 40 is, for example, electrically-conductive polysilicon. The third electrode 40 is electrically insulated from the semiconductor part 10 by an insulating film 43. Also, the third electrode 40 is electrically insulated from the second electrode 30 by an insulating film 45. The insulating films 43 and 45 are, for example, silicon oxide films.

The fourth electrode 50 is, for example, an emitter plate electrically connected to the second electrode 30. The fourth electrode 50 is provided in the trench GT at the front surface of the semiconductor part 10. The fourth electrode 50 includes a material having a larger thermal conductivity than that of the third electrode 40. The fourth electrode 50 includes, for example, a metal such as tungsten, etc. The fourth electrode 50 is electrically insulated from the semiconductor part 10 by an insulating film 53. The fourth electrode 50 may be directly connected to the second electrode 30.

The fourth electrode 50 is electrically isolated from the third electrode 40. For example, a configuration may be used in which the fourth electrode 50 also is electrically insulated from the second electrode 30 by a not-illustrated insulating film, and a potential that is different from that of the third electrode 40 is applied to the fourth electrode 50.

The third electrode 40 and the fourth electrode 50 are arranged in a direction along the front surface of the semiconductor part 10. For example, the fourth electrode 50 is provided between two adjacent third electrodes 40.

The semiconductor part 10 includes, for example, an n-type base layer 11, a p-type base layer 13, an n-type emitter layer 15, a p-type collector layer 17 and an n-type buffer layer 19.

The n-type base layer 11 extends through the entire semiconductor part 10 and has a thickness in the Z-direction corresponding to a prescribed breakdown voltage. The depth of the trench GT extends from the front surface of the semiconductor part 10 to the n-type base layer 11. The lower ends of the third electrode 40 and the fourth electrode 50 are positioned inside the n-type base layer 11.

The p-type base layer 13 is provided between the n-type base layer 11 and the second electrode 30. The p-type base layer 13 includes a portion positioned between the third electrode 40 and the fourth electrode 50. The p-type base layer 13 is provided to face the third electrode 40 with the insulating film 43 interposed. Also, the p-type base layer 13 is provided to face the fourth electrode with the insulating film 53 interposed.

The n-type emitter layer 15 is provided between the p-type base layer 13 and the second electrode 30. The n-type emitter layer 15 includes an n-type impurity with a higher concentration than the n-type impurity of the n-type base layer 11. For example, the n-type base layer 11 contacts the second electrode 30 and is electrically connected to the second electrode 30.

The p-type collector layer 17 is provided between the n-type base layer 11 and the first electrode 20. Although the p-type collector layer 17 includes, for example, a p-type impurity with a higher concentration than the p-type impurity of the p-type base layer 13, this is not limited thereto. For example, the p-type collector layer 17 contacts the first electrode 20 and is electrically connected to the first electrode 20.

The n-type buffer layer 19 is provided between the n-type base layer 11 and the p-type collector layer 17. The n-type buffer layer 19 includes an n-type impurity with a higher concentration than the n-type impurity of the n-type base layer 11.

For example, the third electrode 40 functions as a gate electrode inducing an n-type inversion layer at the interface between the p-type base layer 13 and the insulating film 43. For example, the fourth electrode 50 functions as an electrode controlling the carrier distribution inside the n-type base layer 11.

Figure 2:
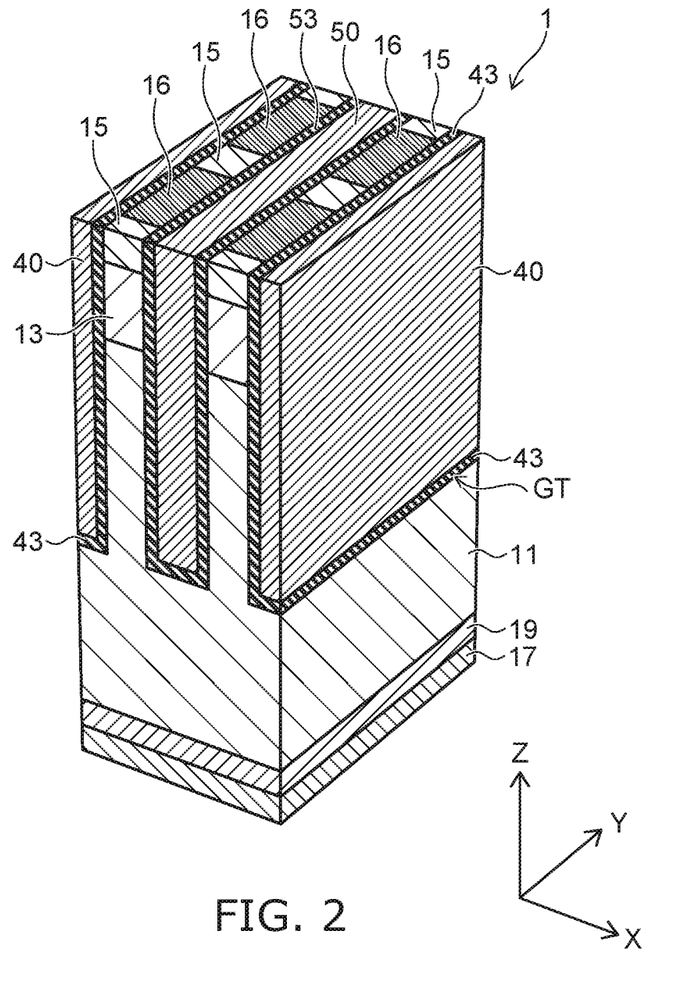
FIG. 2 is a perspective view schematically showing the semiconductor device according to the first embodiment.

FIG. 2 is a perspective view schematically showing the semiconductor device 1 according to the first embodiment. In FIG. 2, the first electrode 20, the second electrode 30 and the insulating film 45 are not illustrated; and the configuration of the semiconductor part 10 is illustrated in more detail. As shown in FIG. 2, the semiconductor part 10 further includes a p-type contact layer 16. The p-type contact layer 16 is provided between the p-type base layer 13 and the second electrode 30 and includes a p-type impurity with a higher concentration than the concentration of the p-type impurity in the p-type base layer 13.

For example, the third electrode 40 and the fourth electrode 50 are provided in plate configurations extending in the Y-direction. The n-type emitter layer 15 and the p-type contact layer 16 each are selectively provided between the third electrode 40 and the fourth electrode 50 next to the third electrode 40. For example, the n-type emitter layer 15 and the p-type contact layer 16 are arranged alternately along the Y-direction. The second electrode 30 contacts and is electrically connected to the n-type emitter layer 15 and the p-type contact layer 16 exposed at the front surface of the semiconductor part 10. The second electrode 30 is electrically connected to the p-type base layer 13 via the p-type contact layer 16.

Figure 3A:
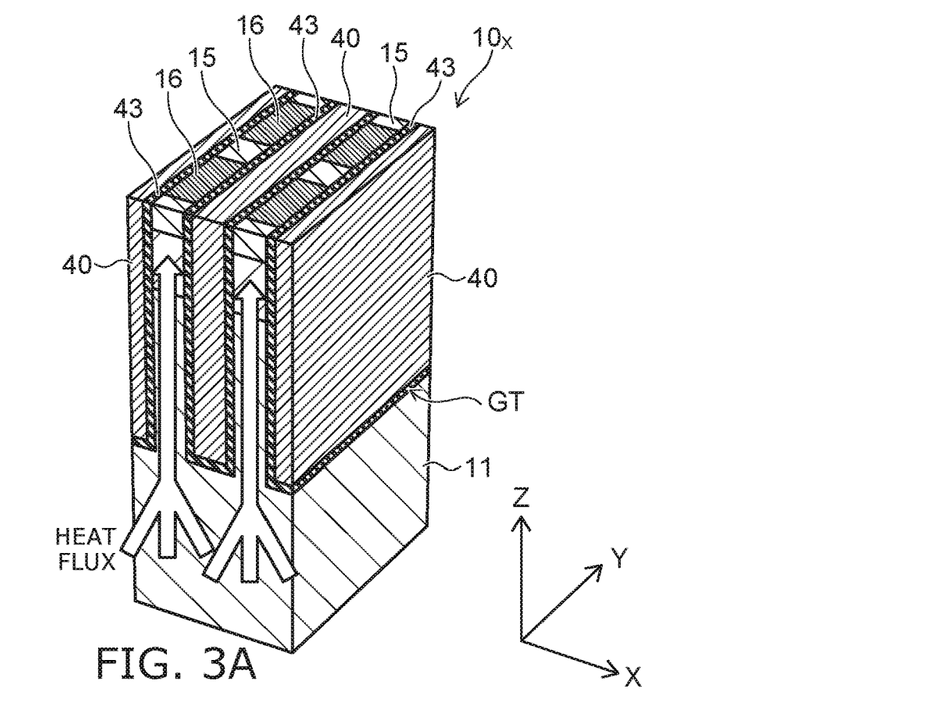
FIGS. 3A and 3B are perspective views schematically showing characteristics of the semiconductor device according to the first embodiment.
Figure 3B:
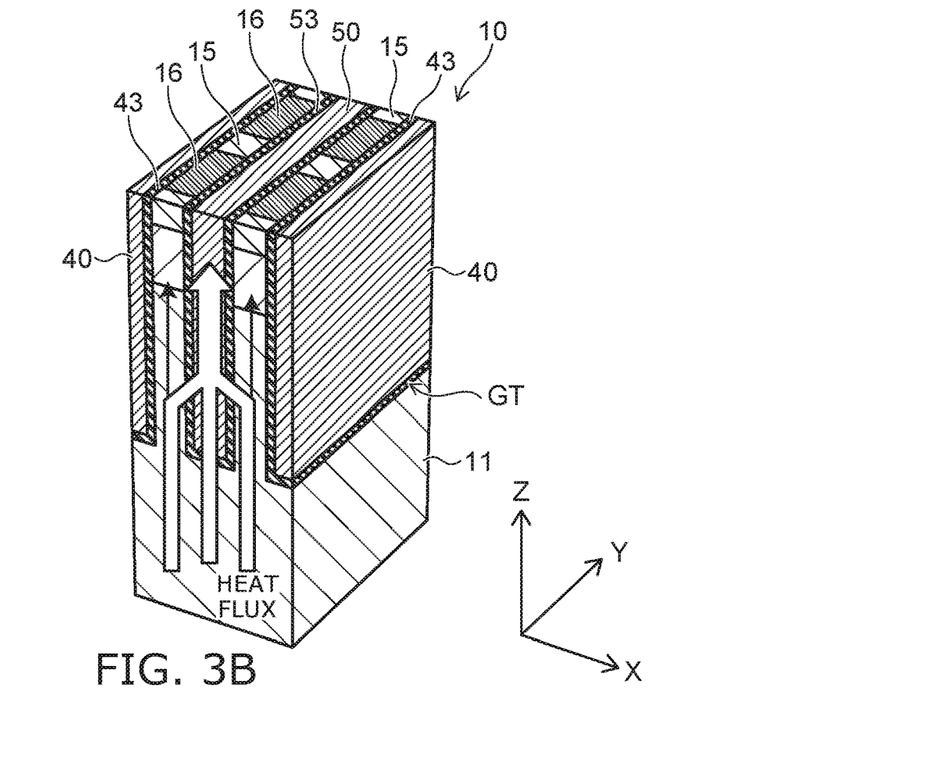

FIGS. 3A and 3B are perspective views schematically showing characteristics of the semiconductor device 1 according to the first embodiment. FIG. 3A is a schematic view showing a semiconductor part $10_X$ of the semiconductor device according to a comparative example. FIG. 3B is a schematic view showing the semiconductor part 10 of the semiconductor device 1 according to the embodiment.

In the semiconductor part $10_X$ shown in FIG. 3A, the fourth electrode 50 is not provided; and the third electrodes 40 are arranged in the X-direction. For example, when a gate voltage higher than a threshold voltage is applied to the third electrode 40, an n-type inversion layer is induced at the interface between the p-type base layer 13 and the insulating film 43; and an ON-current flows between the emitter-collector electrodes. Therefore, Joule heat that corresponds to the electrical resistance is generated in the n-type base layer 11. Although the heat generated in the n-type base layer 11 is dissipated externally via, for example, the first electrode 20, a portion of the heat flows to the second electrode 30.

As shown in FIG. 3A, the heat that is generated in the n-type base layer 11 moves toward the second electrode 30 via the p-type base layer 13 and the n-type emitter layer 15. Therefore, the temperature of the n-type base layer 11, the p-type base layer 13, and the n-type emitter layer 15 positioned between the adjacent third electrodes 40 increases. Therefore, the potential barrier between the n-type base layer 11 and the p-type base layer 13 decreases; and a current that does not go through the n-type inversion layer induced at the interface between the p-type base layer 13 and the insulating film 43 increases acceleratingly. As a result, for example, latchup of the parasitic transistor between the n-type base layer 11 and the n-type emitter layer 15 occurs;

and gate driving is impossible. Therefore, there are cases where breakdown due to overcurrent occurs.

Conversely, in the semiconductor part 10 shown in FIG. 3B, the fourth electrode 50 is provided between the two adjacent third electrodes 40. The fourth electrode 50 includes a metal which is a material having a larger thermal conductivity than that of the material, e.g., polysilicon, of the third electrode 40. Therefore, the greater part of the heat generated in the n-type base layer 11 is dissipated toward the second electrode 30 via the fourth electrode 50. Accordingly, the movement of the heat dissipated toward the second electrode 30 via the p-type base layer 13 and the n-type emitter layer 15 is suppressed; and the temperature increase of the p-type base layer 13 and the n-type emitter layer 15 also is suppressed. As a result, the latchup of the parasitic transistor between the n-type base layer 11 and the n-type emitter layer 15 can be avoided; and the breakdown due to the overcurrent of the semiconductor device 1 can be prevented.

To promote the dissipation of the heat via the fourth electrode 50, it is favorable for the insulating film 53 to include a material having a larger thermal conductivity than that of the material of the insulating film 43. The insulating film 53 includes, for example, a material such as a silicon nitride film, an aluminum nitride film, etc., having a larger thermal conductivity than that of a silicon oxide film.

FIGS. 4A to 4D are schematic cross-sectional views illustrating the terminal structure of the semiconductor device 1 according to the first embodiment. The p-type collector layer 17, the n-type buffer layer 19, and the first electrode 20 are not illustrated in FIGS. 4A to 4D.

Figure 4A:
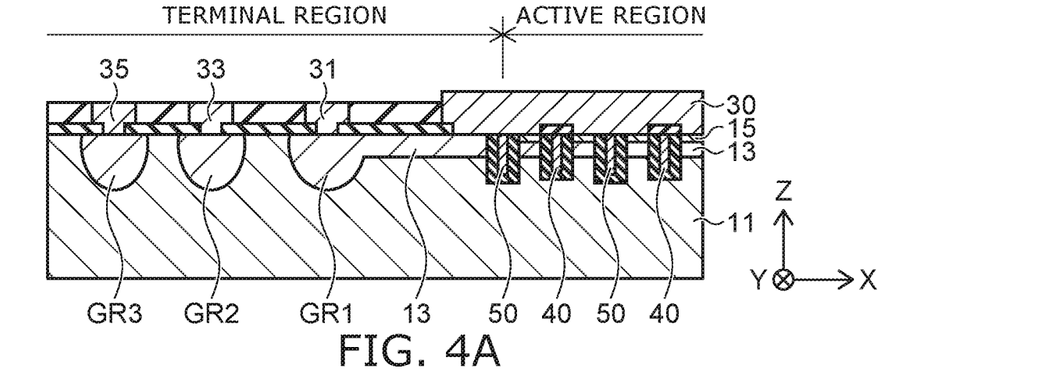
FIGS. 4A to 4D are schematic cross-sectional views illustrating the terminal structure of the semiconductor device according to the first embodiment.

As shown in FIG. 4A, the semiconductor device 1 includes an active region where the third electrode 40 and the fourth electrode 50 are provided, and a terminal region surrounding the active region. A p-type guard ring GR1, a p-type guard ring GR2, and a p-type guard ring GR3 are provided in the terminal region. Also, a number of guard rings corresponding to the desired breakdown voltage are arranged in the terminal region outside the p-type guard ring GR3. The p-type guard ring GR1 is provided to be linked to the p-type base layer 13 and is electrically connected to the second electrode 30 via the p-type base layer. The p-type guard rings GR2 and GR3 are provided so that the potentials are in the floating state. The guard rings GR1, GR2, and GR3 are connected respectively to an electrode 31 and floating electrodes 33 and 35. This is similar for FIGS. 4B to 4D recited below.

In the example shown in FIG. 4A, the fourth electrode 50 is provided at the boundary between the active region and the terminal region. Thereby, the heat that is generated in the terminal region can be dissipated efficiently toward the second electrode 30 via the fourth electrode 50. For example, the Joule heat that is caused by the avalanche current, the current concentration, etc., occurring at turn-off of the semiconductor device 1 can be dissipated via the fourth electrode 50. Thereby, the avalanche resistance and/or the avalanche energy at turn-off of the terminal portion can be improved; and the breakdown of the semiconductor device 1 can be avoided.

Figure 4B:
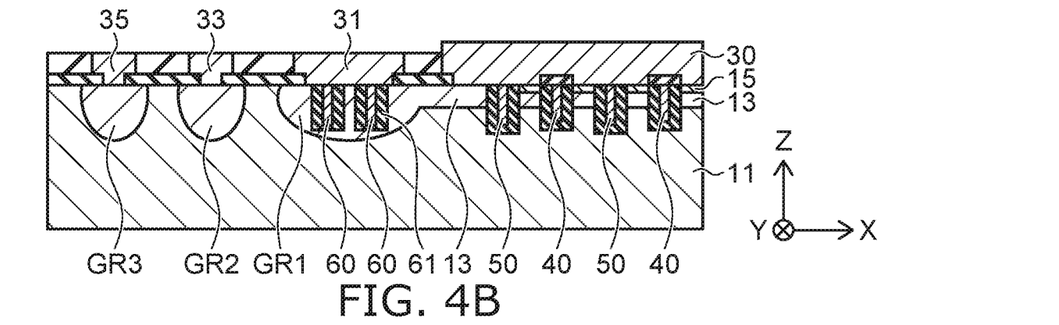

In the example shown in FIG. 4B, a fifth electrode 60 is further provided. The fifth electrode 60 is, for example, a plate-shaped electrode. For example, multiple fifth electrodes 60 are provided in the p-type guard ring GR1. For example, the fifth electrode 60 is electrically connected to the electrode 31 and electrically connected to the p-type guard ring GR1.

The fifth electrode 60 includes, for example, a metal such as tungsten, etc. An insulating film 61 is, for example, a silicon oxide film. It is favorable for the insulating film 61 to be a silicon nitride film or the like having a larger thermal conductivity than that of a silicon oxide film.

Thus, the fifth electrode 60 is provided at the boundary between the active region and the terminal region, e.g., in the p-type guard ring GR1 where electric field concentrates easily at turn-off. The dissipation toward the electrode 31 of the heat generated in the terminal region can be promoted thereby.

Figure 4C:
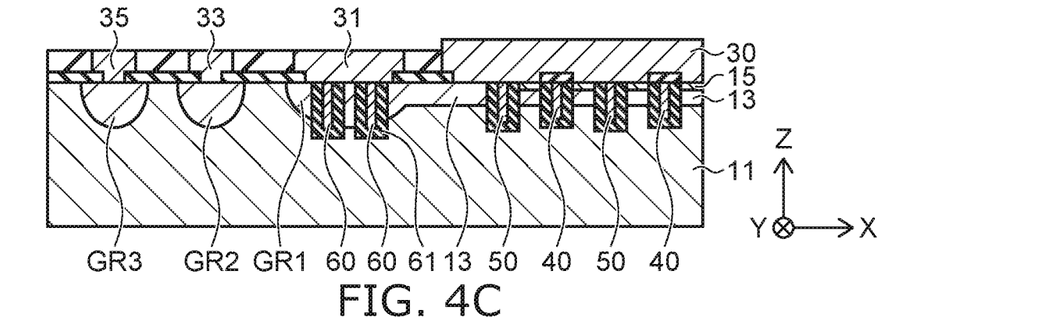

As shown in FIG. 4C, the fifth electrode 60 may be provided to pierce the p-type guard ring GR1 and have a length reaching the n-type base layer 11. Thereby, the heat that is generated in the n-type base layer 11 in the terminal region can be dissipated efficiently via the electrode 31.

Figure 4D:
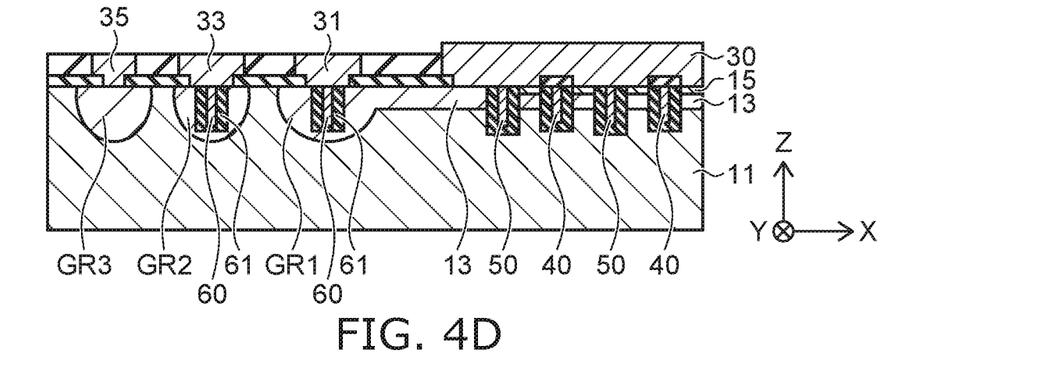

As shown in FIG. 4D, the fifth electrodes 60 may be provided respectively in the p-type guard rings GR1 and GR2. The heat that is generated in a wide area of the terminal region can be dissipated efficiently thereby. Although the p-type guard ring GR2 is not connected to the second electrode 30 electrically, the heat can be dissipated via the floating electrode 33.

The configurations shown in FIGS. 4A to 4D are illustrations; and the embodiment is not limited thereto. For example, a configuration also may be used in which the fourth electrode 50 is not provided in the active region and is provided only at the boundary between the active region and the terminal region. Also, a configuration may be used in which the fourth electrode 50 is not provided in the examples shown in FIGS. 4B to 4D. Any combination of FIGS. 4A to 4D may be used.

Figure 5:
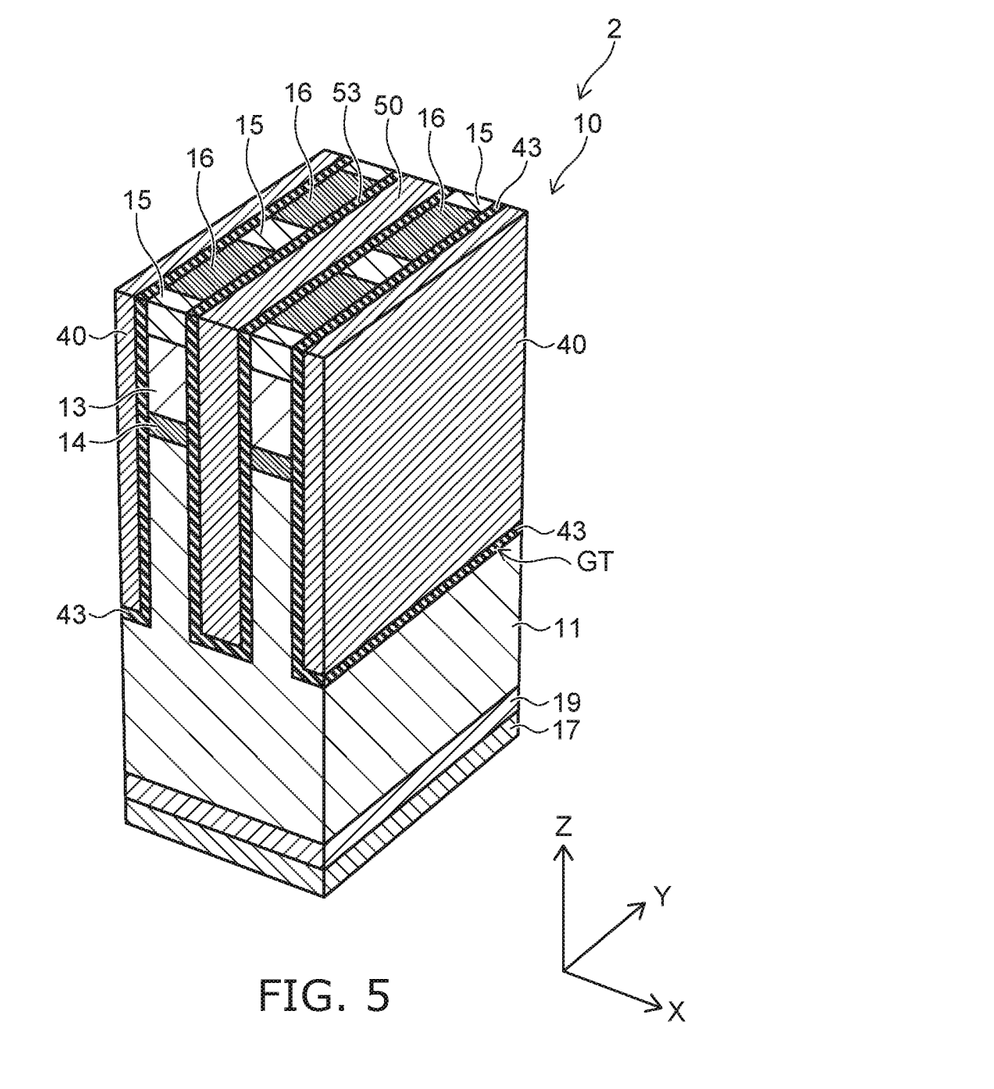
FIG. 5 is a perspective view schematically showing a semiconductor device according to a first modification of the first embodiment.

FIG. 5 is a schematic cross-sectional view showing a semiconductor device 2 according to a first modification of the first embodiment. In FIG. 5, the first electrode 20, the second electrode 30, and the insulating film 45 are not illustrated; and the structure of the semiconductor part 10 is shown.

In the semiconductor device 2, the semiconductor part 10 further includes an n-type barrier layer 14. The n-type barrier layer 14 is provided between the n-type base layer 11 and the p-type base layer 13. The n-type barrier layer 14 includes an n-type impurity with a higher concentration than the n-type impurity of the n-type base layer 11. The n-type barrier layer 14 includes the n-type impurity with a lower concentration than the n-type impurity of the n-type emitter layer 15.

By providing the n-type barrier layer 14, the movement of the holes from the n-type base layer 11 toward the p-type base layer 13 in the ON-state is suppressed; and the hole concentration in the n-type base layer 11 can be increased. Accordingly, injection of the electrons from the n-type emitter layer 15 into the n-type base layer 11 is promoted; and the carrier density inside the n-type base layer 11 can be increased. The ON-resistance of the semiconductor device 2 can be reduced thereby.

Figure 6:
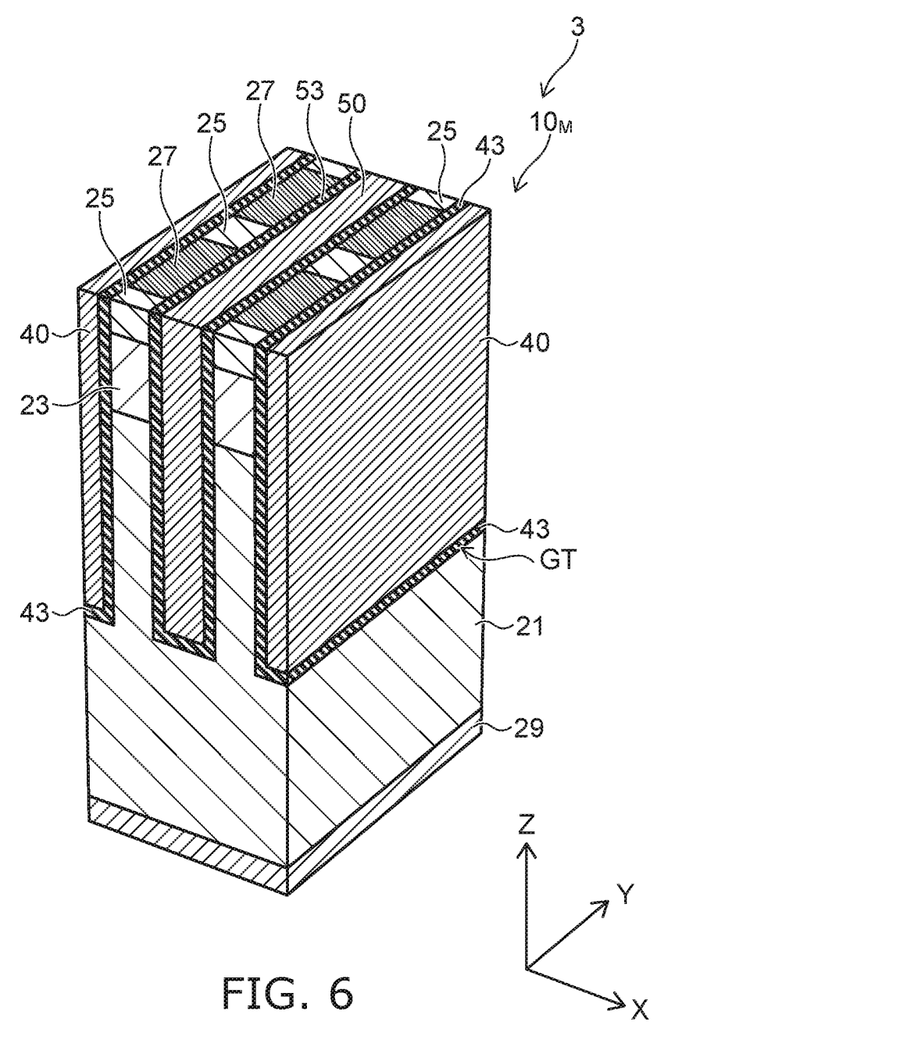
FIG. 6 is a perspective view schematically showing a semiconductor device according to a second modification of the first embodiment.

FIG. 6 is a schematic cross-sectional view showing a semiconductor device 3 according to a second modification of the first embodiment. The semiconductor device 3 is, for example, a MOSFET. In FIG. 6, the drain electrode, the source electrode, and the insulating film 45 are not illustrated; and the structure of a semiconductor part $10_M$ is shown. The drain electrode is provided on the back surface of the semiconductor part $10_M$; and the source electrode is provided at the front surface of the semiconductor part $10_M$.

In the semiconductor device 3 shown in FIG. 6, the semiconductor part $10_M$ includes an n-type drift layer 21, a p-type diffusion layer 23, an n-type source layer 25, a p-type contact layer 27, and an n-type drain layer 29. The semiconductor part $10_M$ does not include the p-type collector layer 17.

The p-type diffusion layer 23 is provided between the n-type drift layer 21 and the source electrode (not illustrated). Also, the p-type diffusion layer 23 is positioned between the third electrode 40 and the fourth electrode 50 (or includes a portion positioned between the third electrode 40 and the fourth electrode 50).

The n-type source layer 25 and the p-type contact layer 27 each are selectively provided between the p-type diffusion layer 23 and the source electrode (not illustrated). The n-type source layer 25 includes an n-type impurity with a higher concentration than the n-type impurity of the n-type drift layer 21. The p-type contact layer 27 includes a p-type impurity with a higher concentration than the p-type impurity of the p-type diffusion layer 23. The n-type source layer 25 and the p-type contact layer 27 are electrically connected to the source electrode (not illustrated). The p-type diffusion layer 23 is electrically connected to the source electrode (not illustrated) via the p-type contact layer 27.

The n-type drain layer 29 is provided between the n-type drift layer 21 and the drain electrode (not illustrated). The n-type drain layer 29 includes an n-type impurity with a higher concentration than the n-type impurity of the n-type drift layer 21 and is electrically connected to the drain electrode (not illustrated).

In the semiconductor device 3 as well, by disposing the fourth electrode 50 between the third electrodes 40, the heat that is generated in the n-type drift layer 21 can be dissipated efficiently via the source electrode (not illustrated).

Figure 7:
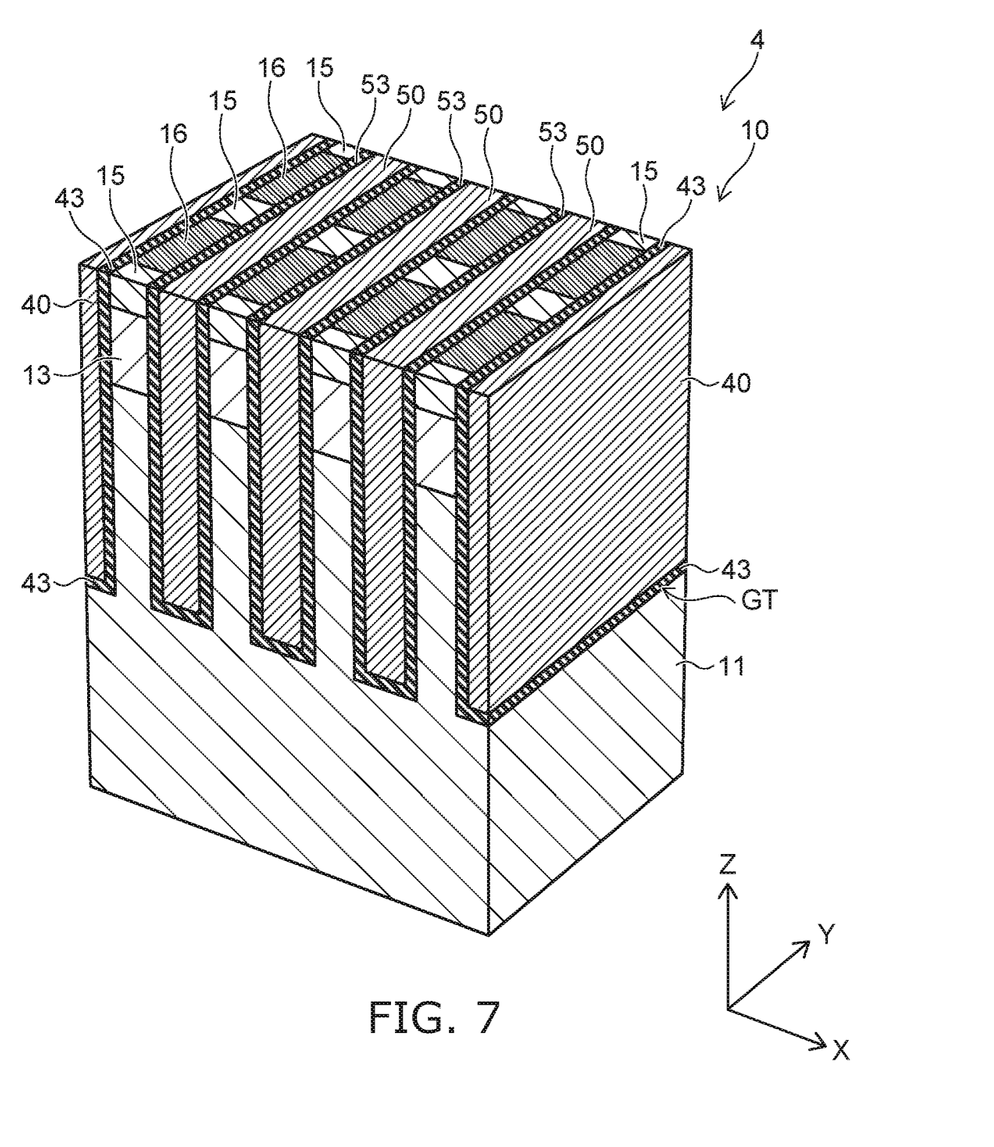
FIG. 7 is a perspective view schematically showing a semiconductor device according to a third modification of the first embodiment.

FIG. 7 is a schematic cross-sectional view showing a semiconductor device 4 according to a third modification of the first embodiment. In FIG. 7, the p-type collector layer 17, the n-type buffer layer 19, the first electrode 20, the second electrode 30, and the insulating film 45 are not illustrated; and the structure of the semiconductor part 10 is shown.

In the semiconductor device 4 shown in FIG. 7, three fourth electrodes 50 are provided between two adjacent third electrodes 40. The embodiment is not limited to the example; and two, four, or more fourth electrodes 50 may be provided between the two adjacent third electrodes 40.

Thus, by disposing multiple fourth electrodes 50 between two adjacent third electrodes 40, the heat that is generated in the n-type base layer 11 can be dissipated more efficiently via the second electrode 30.

Figure 8:
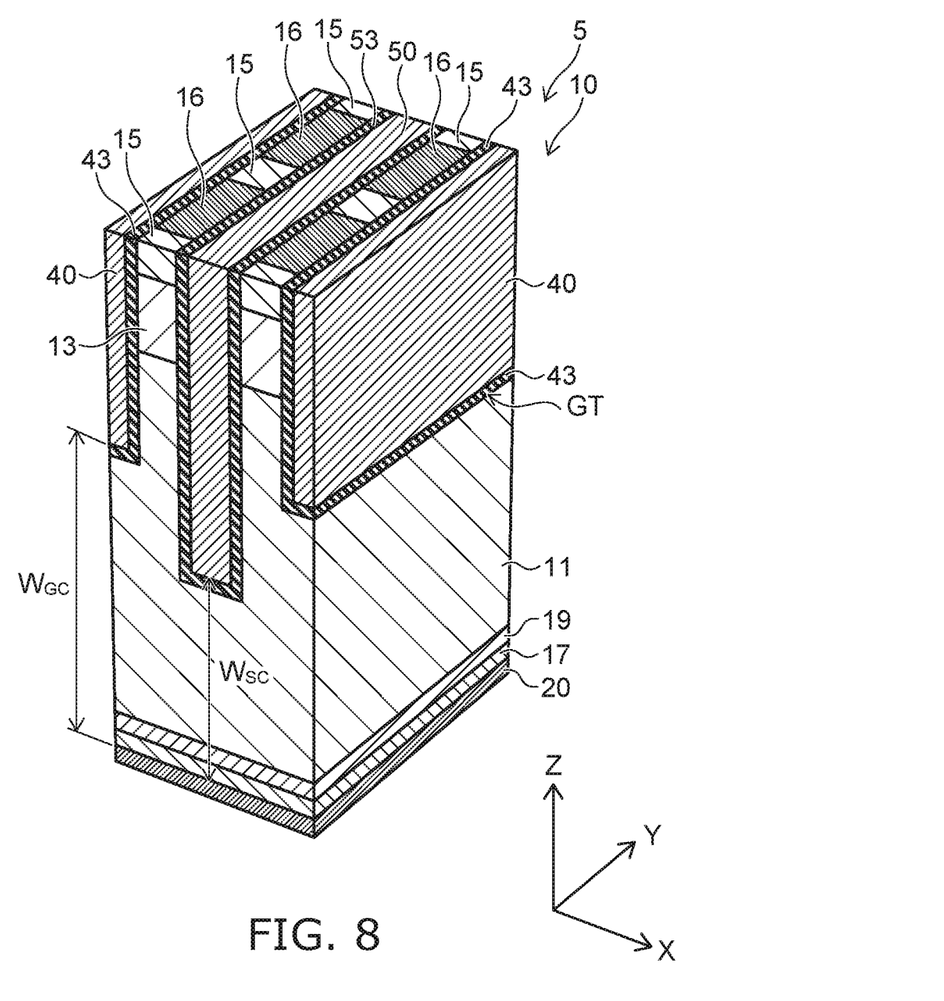
FIG. 8 is a perspective view schematically showing a semiconductor device according to a fourth modification of the first embodiment.

FIG. 8 is a schematic cross-sectional view showing a semiconductor device 5 according to a fourth modification of the first embodiment. In FIG. 8, the second electrode 30 and the insulating film 45 are not illustrated; and the structure of the semiconductor part 10 is shown.

In the semiconductor device 5 shown in FIG. 8, the fourth electrode 50 extends more deeply into the n-type base layer 11 than does the third electrode 40. In other words, a spacing $W_{SC}$ between the first electrode 20 and the fourth electrode 50 is narrower than a spacing $W_{GC}$ between the first electrode 20 and the third electrode 40. Thereby, the heat that is generated in the n-type base layer 11 can be dissipated more efficiently via the fourth electrode 50 and the second electrode 30.

FIGS. 9A to 9C and FIGS. 10A to 10C are schematic cross-sectional views illustrating structures of the fourth electrode 50 of the semiconductor device 1 according to the first embodiment.

Figure 9A:
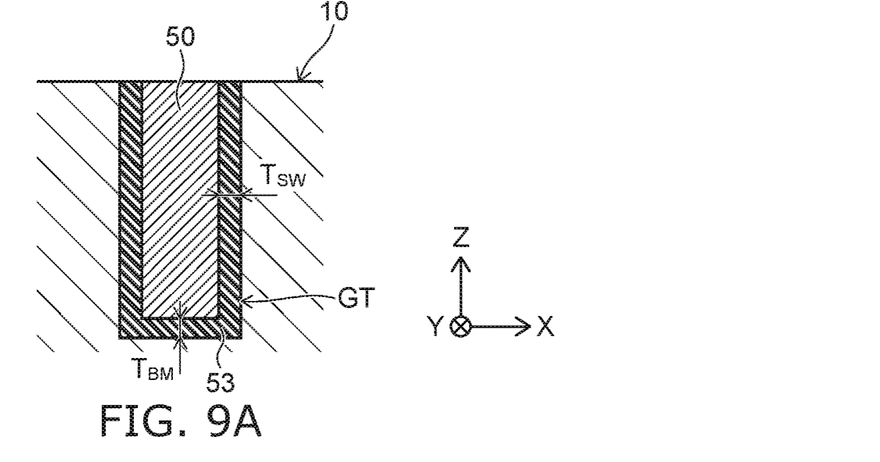
FIGS. 9A to 9C are schematic cross-sectional views illustrating structures of the fourth electrode of the semiconductor device 1 according to the first embodiment.

As shown in FIG. 9A, the insulating film 53 which electrically insulates the fourth electrode 50 from the semiconductor part 10 has, for example, a uniform film thickness. In other words, a film thickness $T_{SW}$ of the portion of the insulating film 53 provided on the inner wall of the trench GT is substantially the same as a film thickness $T_{BM}$ of the portion of the insulating film 53 provided on the bottom surface of the trench GT.

Figure 9B:
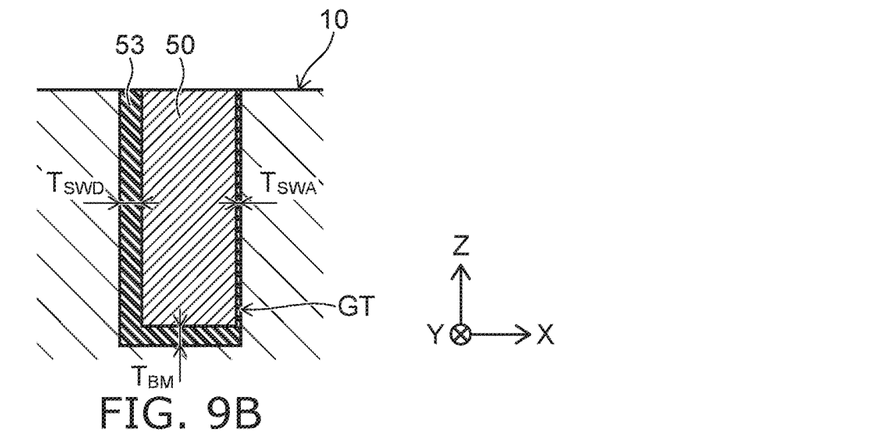

As shown in FIG. 9B, the insulating film 53 includes two portions that have different film thicknesses and are provided on the inner wall of the trench GT. The insulating film 53 includes, for example, a portion having a film thickness $T_{SWA}$, and a portion having a film thickness $T_{SWD}$. The film thickness $T_{SWD}$ is thicker than the film thickness $T_{SWA}$. For example, in the semiconductor device 4 shown in FIG. 7, the portion that has the film thickness $T_{SWA}$ is positioned between the semiconductor part 10 and the side surface of the fourth electrode 50 facing the third electrode 40. The portion that has the film thickness $T_{SWD}$ is positioned between the semiconductor part 10 and the side surface of the fourth electrode 50 facing another fourth electrode 50.

Also, in the example shown in FIG. 4A, the portion of the insulating film 53 having the film thickness $T_{SWA}$ is positioned between the semiconductor part 10 and the side surface facing the active region of the fourth electrode 50 provided at the boundary between the active region and the terminal region. The portion that has the film thickness $T_{SWD}$ is positioned between the semiconductor part 10 and the side surface of the same fourth electrode 50 facing the terminal region.

In other words, in the ON-state, by setting the film thickness of the insulating film 53 to be thin at the side facing the region where the collector current flows, the thermal conduction from the n-type base layer 11 toward the fourth electrode 50 can be promoted. In the example, the film thickness $T_{BM}$ of the portion of the insulating film 53 provided on the bottom surface of the trench GT is thicker than the film thickness $T_{SWA}$ and thinner than the film thickness $T_{SWD}$. The film thickness $T_{BM}$ may be substantially the same as the film thickness $T_{SWA}$.

Figure 9C:
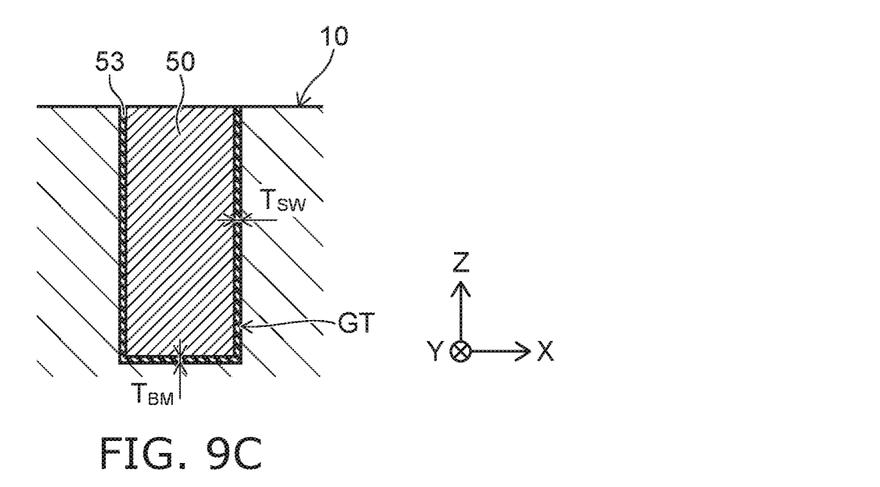

As shown in FIG. 9C, the insulating film 53 may be provided to be uniformly thin. In other words, by setting the insulating film 53 to be thin, the thermal conduction toward the fourth electrode 50 can be promoted.

Figure 10A:
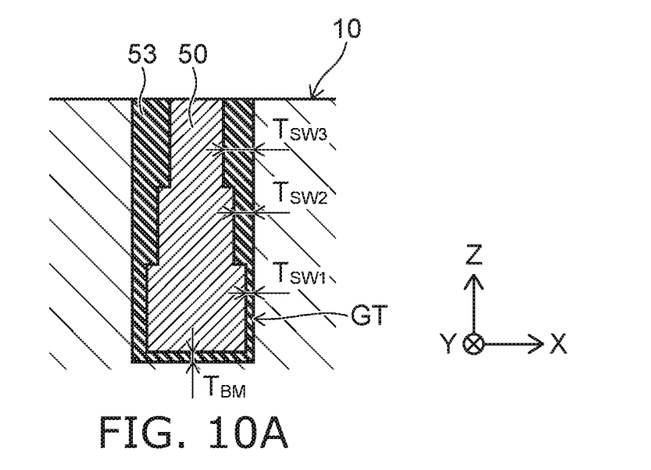
FIGS. 10A to 10C are schematic cross-sectional views illustrating other structures of the fourth electrode of the semiconductor device 1 according to the first embodiment.

As shown in FIG. 10A, a configuration may be used in which the portion of the insulating film 53 proximal to the bottom surface of the trench GT of the fourth electrode 50 is set to be thinner. For example, the insulating film 53 has film thicknesses $T_{SW1}$, $T_{SW2}$, and $T_{SW3}$ having three stages along the inner wall of the trench GT, and has the relationship of $T_{SW1} < T_{SW2} < T_{SW3}$ from the side proximal to the bottom of the trench GT.

In other words, by setting the film thickness of the portion of the insulating film 53 proximal to the heat generation region inside the n-type base layer 11 to be thin, the thermal conduction from the n-type base layer 11 toward the fourth electrode 50 can be promoted.

Figure 10B:
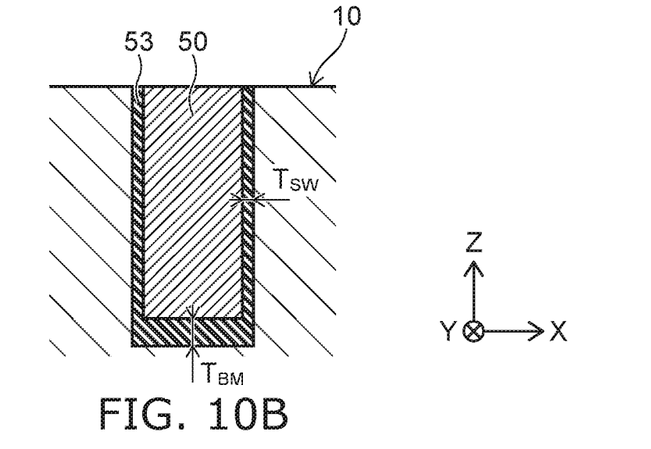
Figure 10C:
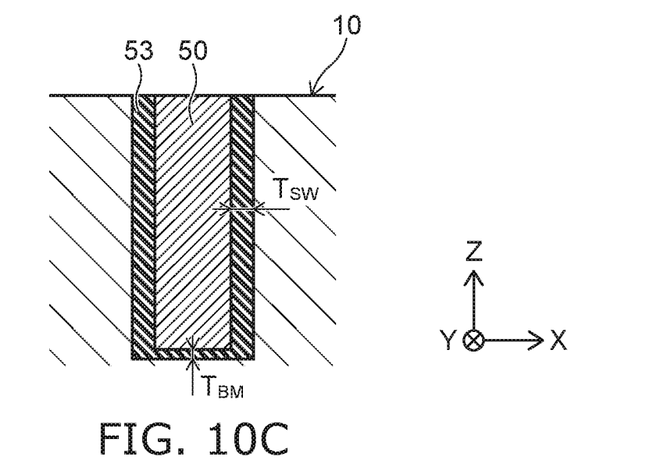

As shown in FIG. 10B, the film thickness $T_{SW}$ of the portion of the insulating film 53 positioned between the fourth electrode 50 and the inner wall of the trench GT is set to be thinner than the film thickness $T_{BM}$ of the portion of the insulating film 53 positioned between the fourth electrode 50 and the bottom surface of the trench GT. Also, as shown in FIG. 10C, the film thickness $T_{BM}$ may be set to be thinner than the film thickness $T_{SW}$.

Thus, the film thickness of the insulating film 53 can be selected as appropriate according to the position where the fourth electrode 50 is provided and the position of the heat generation region inside the n-type base layer 11.

Second Embodiment

Figure 11A:
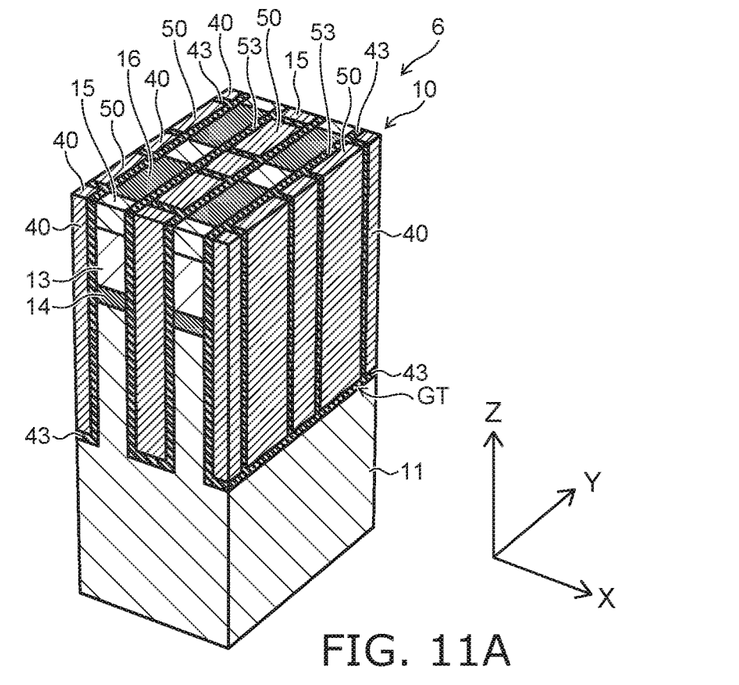
FIGS. 11A and 11B are perspective views schematically showing semiconductor devices according to a second embodiment.
Figure 11B:
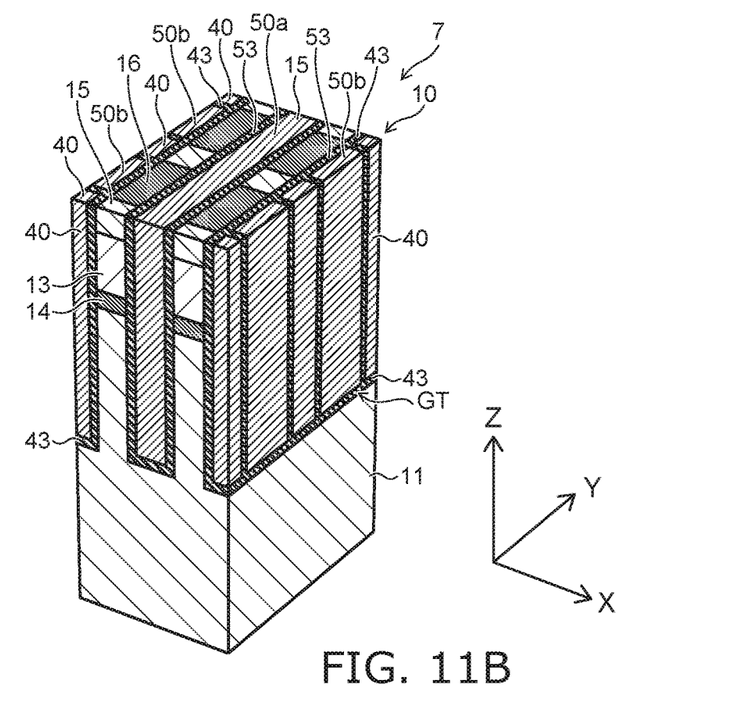

FIGS. 11A and 11B are schematic cross-sectional views showing semiconductor devices 6 and 7 according to a second embodiment. In FIGS. 11A and 11B, the p-type collector layer 17, the n-type buffer layer 19, the first electrode 20, the second electrode 30, and the insulating film 45 are not illustrated; and the structure of the semiconductor part 10 is shown.

A semiconductor device 6 shown in FIG. 11A includes multiple third electrodes 40 and multiple fourth electrodes 50 provided in one trench GT. The third electrodes 40 and the fourth electrodes 50 are arranged alternately along the extension direction of the trench GT (e.g., the Y-direction) extending along the front surface of the semiconductor part 10. The third electrodes 40 and the fourth electrodes 50 each extend in the Z-direction and include end portions positioned inside the n-type base layer 11.

The third electrode 40 is electrically insulated from the semiconductor part 10 by the insulating film 43. The fourth electrode 50 is electrically insulated from the semiconductor part 10 by the insulating film 53. For example, the third electrode 40 and the fourth electrode 50 that are next to each other in the extension direction of the trench GT (e.g., the Y-direction) are electrically insulated from each other by providing one of the insulating film 43 or the insulating film 53 between the third electrode 40 and the fourth electrode 50.

For example, the p-type base layer 13 is positioned between the two third electrodes 40 next to each other in the X-direction and between the two fourth electrodes 50 next to each other in the X-direction. In the case where the p-type base layer 13 is provided as a continuous body, the p-type base layer 13 includes a portion positioned between the two third electrodes 40 next to each other in the X-direction and between the two fourth electrodes 50 next to each other in the X-direction.

The n-type emitter layer 15 is selectively provided between the p-type base layer 13 and the second electrode 30 (referring to FIG. 1) and is positioned between the two third electrodes 40 next to each other in the X-direction. In other words, the n-type emitter layer 15 is provided at a position contacting the insulating film 43.

The p-type contact layer 16 is selectively provided between the p-type base layer 13 and the second electrode 30 (referring to FIG. 1) and is positioned between the two fourth electrodes 50 next to each other in the X-direction. In other words, the p-type contact layer 16 is provided at a position contacting the insulating film 53.

The semiconductor part 10 further includes the n-type barrier layer 14 positioned between the n-type base layer 11 and the p-type base layer 13. Also, the semiconductor part 10 may have a structure not including the n-type barrier layer 14.

In the semiconductor device 6 according to the embodiment as well, the fourth electrode 50 includes a material, e.g., a metal having a larger thermal conductivity than that of the material of the third electrode 40. Thereby, the heat that is generated in the n-type base layer 11 can be dissipated efficiently via the fourth electrode 50 and the second electrode 30; and the breakdown due to the overcurrent of the semiconductor device 6 can be avoided.

Also, the insulating film 53 includes a material having a larger thermal conductivity than that of the material of the insulating film 43. The thermal conduction from the n-type base layer 11 toward the fourth electrode 50 can be promoted further thereby.

In a semiconductor device 7 shown in FIG. 11B, fourth electrodes 50a and 50b are provided in addition to the third electrode 40. The fourth electrode 50a is provided in another trench GT between the trenches GT where the third electrodes 40 are disposed. The fourth electrode 50a extends in the Y-direction.

On the other hand, the fourth electrode 50b is provided in one trench GT with the third electrode 40. The third electrode 40 and the fourth electrode 50b are arranged alternately along the extension direction of the trench GT (e.g., the Y-direction).

For example, the fourth electrodes 50a and 50b include materials having thermal conductivities larger than that of the material of the third electrode 40. The fourth electrode 50b may include a material having a thermal conductivity larger than those of the materials of the third electrode 40 and the fourth electrode 50a.

In the semiconductor device 7 as well, the heat that is generated in the n-type base layer 11 can be dissipated efficiently via the fourth electrodes 50a and 50b and the second electrode 30; and the breakdown due to the overcurrent can be avoided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a semiconductor part including a first semiconductor layer of a first conductivity type;
a first electrode provided at a back surface of the semiconductor part;
a second electrode provided at a front surface of the semiconductor part;
a third electrode provided between the semiconductor part and the second electrode, the third electrode being electrically insulated from the semiconductor part by a first insulating film, the third electrode being electrically insulated from the second electrode by a second insulating film; and
a fourth electrode provided between the semiconductor part and the second electrode, the fourth electrode being electrically insulated from the semiconductor part by a third insulating film, the fourth electrode being electrically isolated from the third electrode, the third and fourth electrodes being arranged in a first direction, the first direction being along the front surface of the semiconductor part, the fourth electrode being provided next to the third electrode in the first direction, the fourth electrode physically contacting the second electrode,
the semiconductor part further including a second semiconductor layer of a second conductivity type, a third semiconductor layer of the first conductivity type, a fourth semiconductor layer of the second conductivity type and a fifth semiconductor layer of the first conductivity type, the second to fifth semiconductor layers being provided between the third and fourth electrodes,
the second semiconductor layer being provided between the first semiconductor layer and the second electrode, the third semiconductor layer being selectively provided between the second semiconductor layer and the second electrode, the third semiconductor layer physically contacting the first insulating film and the third insulating film, the third semiconductor layer facing the third electrode via the first insulating film and facing the fourth electrode via the third insulating film, the fourth semiconductor layer being selectively provided between the second semiconductor layer and the second electrode, the fourth semiconductor layer including a second-conductivity-type impurity with a concentration higher than a concentration of a second-conductivity-type impurity in the second semiconductor layer, the fifth semiconductor layer being provided between the first semiconductor layer and the second semiconductor layer, the fifth semiconductor layer including a first-conductivity-type impurity with a concentration higher than a concentration of a first-conductivity-type impurity in the first semiconductor layer, the third and fourth electrodes extending along the front surface of the semiconductor part, the third and fourth electrodes having an extending direction along the front surface of the semiconductor part, the third and fourth semiconductor layers being alternately arranged in the extending direction between the third and fourth electrodes, the third electrode opposing the second semiconductor layer with the first insulating film interposed, the third electrode extending into the first semiconductor layer, the fourth electrode opposing the second semiconductor layer with the third insulating film interposed, the fourth electrode extending into the first semiconductor layer, the fourth electrode including a material having a larger thermal conductivity than a thermal conductivity of a material of the third electrode.

2. The device according to claim 1, wherein a plurality of the third electrodes and a plurality of the fourth electrodes are provided, and the plurality of third electrodes and the plurality of fourth electrodes are provided in a trench, the trench being provided at the front surface of the semiconductor part, the third electrodes and the fourth electrodes being arranged alternately in the first direction.

3. The device according to claim 1, wherein the fourth electrode is electrically connected to the second electrode.

4. The device according to claim 1, wherein
the third electrode includes a semiconductor, and
the fourth electrode includes a metal.

5. The device according to claim 1, wherein the third and fourth semiconductor layers are electrically connected to the second electrode, and
the second electrode is electrically connected to the second semiconductor layer via the fourth semiconductor layer.

6. The device according to claim 1, wherein the third insulating film includes a material having a larger thermal conductivity than a thermal conductivity of a material of the first insulating film.

7. The device according to claim 1, wherein a spacing between the fourth electrode and the first electrode is narrower than a spacing between the third electrode and the first electrode.

8. The device according to claim 1, wherein the semiconductor part further includes a sixth semiconductor layer of the second conductivity type provided between the first electrode and the first semiconductor layer.

9. The device according to claim 1, wherein
the third insulating film includes a first portion and a second portion, the first portion having a first film thickness in a second direction, the second direction being from the fourth electrode toward the second semiconductor layer, the second portion having a second film thickness in the second direction,
the fourth electrode is provided between the first portion and the second portion, and
the first thickness is thicker than the second thickness.

10. The device according to claim 1, wherein
the third insulating film includes a first portion and a second portion arranged in a third direction, the third direction being from the first electrode toward the second electrode,
the first portion has a first film thickness in a second direction, the second direction being from the fourth electrode toward the second semiconductor layer,
the second portion has a second film thickness in the second direction, and
the first film thickness is thinner than the second film thickness.

11. The device according to claim 1, wherein
the third insulating film includes a first portion provided between the fourth electrode and the second semiconductor layer, and a second portion positioned between the first electrode and the fourth electrode,
the first portion has a first film thickness in a second direction, the second direction being from the fourth electrode toward the second semiconductor layer,
the second portion has a second film thickness in a third direction, the third direction being from the first electrode toward the second electrode, and
the first film thickness is thinner than the second film thickness.

12. The device according to claim 1, wherein
the third insulating film includes a first portion positioned between the fourth electrode and the second semiconductor layer, and a second portion positioned between the first electrode and the fourth electrode,
the first portion has a first film thickness in a second direction, the second direction being from the fourth electrode toward the second semiconductor layer,
the second portion has a second film thickness in a third direction, the third direction being from the first electrode toward the second electrode, and
the first film thickness is thicker than the second film thickness.

13. The device according to claim 1, wherein
a plurality of the third electrodes and a plurality of the fourth electrodes are provided,
the third electrodes and the fourth electrodes are provided respectively in a plurality of trenches, the third and fourth electrodes being arranged in the first direction, the plurality of trenches being provided at the front surface of the semiconductor part, and one of the fourth electrodes is provided at an end of an arrangement of the third and fourth electrodes along the first direction.

14. The device according to claim 1, further comprising a fifth electrode provided in a trench at the front surface of the semiconductor part, the fifth electrode being electrically insulated from the semiconductor part by a fourth insulating film,
the semiconductor part including a guard ring of the second conductivity type provided along a boundary between an active region and a terminal region, the active region including the second semiconductor layer, the terminal region surrounding the second semiconductor layer at the front surface, the fifth electrode being provided in the guard ring, the fifth electrode including a material having a larger thermal conductivity than the thermal conductivity of the material of the third electrode.

\* \* \* \* \*